United States Patent [19]
Ahmed

[11] 4,230,999
[45] Oct. 28, 1980

[54] OSCILLATOR INCORPORATING NEGATIVE IMPEDANCE NETWORK HAVING CURRENT MIRROR AMPLIFIER

[75] Inventor: Adel A. A. Ahmed, Clinton Twp., Hunturdon, N.J.

[73] Assignee: RCA Corporation, New York, N.Y.

[21] Appl. No.: 24,601

[22] Filed: Mar. 28, 1979

[51] Int. Cl.³ ............................................. H03B 7/06
[52] U.S. Cl. ............................... 331/115; 330/288; 331/117 R; 333/216
[58] Field of Search ................ 333/216, 217; 307/324; 330/288; 331/117 R, 115

[56] References Cited

U.S. PATENT DOCUMENTS

| | | | |
|---|---|---|---|
| 3,843,933 | 10/1974 | Ahmed | 330/26 |
| 3,986,152 | 10/1976 | Howell | 333/216 |
| 4,008,441 | 2/1977 | Schade, Jr. | 330/288 |

FOREIGN PATENT DOCUMENTS

2249645  4/1973  Fed. Rep. of Germany ........... 330/288

Primary Examiner—Paul L. Gensler
Attorney, Agent, or Firm—Paul J. Rasmussen; Allen L. Limberg; John M. O'Meara

[57] ABSTRACT

Within a negative impedance network of the type which includes a current mirror amplifier having transistors in master and slave paths, a bias current is applied at the commonly connected control electrodes of the master and slave path transistors in inverse proportion to the voltage applied across the slave path and thereby a negative impedance characteristic is derived through the slave path.

8 Claims, 3 Drawing Figure

OSCILLATOR INCORPORATING NEGATIVE IMPEDANCE NETWORK HAVING CURRENT MIRROR AMPLIFIER

The present invention relates to negative impedance networks of a type which includes a current mirror amplifier having transistors in master and slave paths.

A negative impedance network of this type is described in U.S. Pat. No. 3,986,152 wherein current flow in the master path of the current mirror amplifier passes through the series connected emitter-collector paths in a pair of bipolar transistors which are of complementary conductivity types. Because PNP transistors are much less efficient than NPN transistors in integrated circuitry, difficulties are presented when this negative impedance network is incorporated on integrated circuit chips. All of the master path current flows through the PNP transistor which consequently must be of considerably greater geometry than the NPN transistor. Even where this greater geometry can be tolerated to some extent, the resistance of the emitter-collector path ($R_{sat}$) through the PNP transistor remains considerably higher than $R_{sat}$ through the NPN transistor and therefore, the voltage drop encountered across the master path is increased significantly by the PNP transistor. Of course, the power dissipation through the master path also increases significantly due to this increased voltage drop thereacross.

The problems mentioned above regarding prior art negative impedance networks are overcome in the network of the invention by applying a bias current at the commonly connected control electrodes in both the master and slave path transistors of the current mirror amplifier in inverse proportion to the voltage being impressed across the slave path, and thereby the negative impedance is derived through the slave path. In one preferred embodiment, this bias current is applied through a transistor of complementary conductivity type relative to the master and slave path transistors. A specific embodiment is disclosed wherein the negative impedance network of the invention is disposed to modify the equivalent dynamic resistance in a circuit having a Q characteristic, such as an oscillator.

Figure 1:
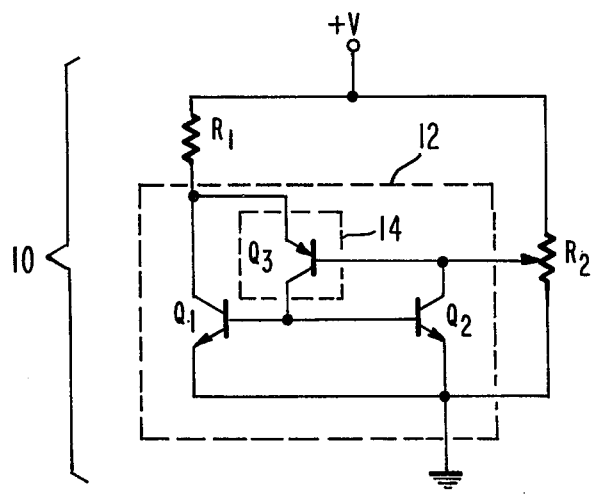
FIG. 1 is a block diagram of the invention and a schematic diagram is also shown therein of one preferred embodiment.

As shown in the block diagram of FIG. 1, the negative impedance network 10 of this invention includes a current mirror amplifier 12 having transistors $Q_1$ and $Q_2$ in master and slave paths respectively. As in conventional current mirror amplifiers, $Q_1$ and $Q_2$ are of the same conductivity type and one side of the master path is commonly connected with one side of the slave path at a reference voltage, such as ground. Current is applied from a supply voltage $+V$ to the other sides of the master and slave paths through a resistor $R_1$ and the wiper of a potentiometer $R_2$ respectively. The control electrodes of $Q_1$ and $Q_2$ are commonly connected to a bias means 14 for applying current thereto through a path independent of both the master and slave paths in inverse proportion to the voltage level being impressed across the slave path.

As known in the electronic arts, the currents drawn by both the master and slave paths of the current mirror amplifier 12 are directly proportional to the level of bias current which is applied to the commonly connected control electrodes of $Q_1$ and $Q_2$. Because of the bias means 14 however, that bias current level is inversely proportional to the voltage level which is impressed across the slave path. Therefore, the current through the slave path decreases as the voltage thereacross increases and a negative impedance is available through the slave path. The voltage level across the slave path may be set by positioning the wiper on $R_2$.

Figure 3:
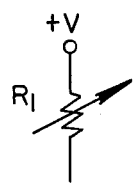
FIG. 3 is a schematic diagram of a modification that can be made to the FIG. 1 or FIG. 2 circuit.

Although many embodiments of the invention are possible, a schematic diagram for one preferred embodiment of the bias means 14 is also shown in FIG. 1. A transistor $Q_3$ of complementary conductivity type relative to $Q_1$ and $Q_2$ is disposed in the bias means 14. The main conduction path of $Q_3$ is connected from between $R_1$ and the main conduction path of $Q_1$ to the commonly connected control electrodes of $Q_1$ and $Q_2$, while the control electrode of $Q_3$ is connected between the wiper of $R_2$ and the main conduction path of $Q_2$. At some voltage level of the wiper on $R_2$, $Q_3$ becomes forward biased and thereby applies the bias current through its main conduction path to render $Q_1$ and $Q_2$ conductive. Because the conductivity of $Q_3$ is complementary to that of $Q_1$ and $Q_2$, however, the voltage level across the main conduction path of $Q_2$ must be decreased to increase the forward bias on $Q_3$ and thereby increase the bias current level, to increase the current flow through the main conduction paths of $Q_1$ and $Q_2$. Conseqently, current flow is only increased through the main conduction path of $Q_2$ when the voltage level thereacross is decreased and therefore, the main conduction path of $Q_2$ presents a negative impedance characteristic. When $Q_3$ is forward biased, the level of bias current applied at the commonly connected control electrodes of $Q_1$ and $Q_2$ is inversely proportional to the magnitude of $R_1$. Consequently, $R_1$ may be a variable resistor as shown in FIG. 3 in networks where the negative impedance is to be adjustable.

As is known in the art, current flow through the master and slave paths of the current mirror amplifier 12 would be related by the emitter area ratio of $Q_1$ and $Q_2$ where those transistors have vertical structures, such as for the NPN transistors of FIG. 1 in integrated circuitry. This emitter area ratio may be utilized to predetermine the change in current flow that is encountered through the emitter-collector path of $Q_2$ due to a change in the voltage level thereacross and thereby fix the negative impedance. Where PNP transistors having lateral structures in integrated circuitry are utilized for $Q_1$ and $Q_2$ the current flow through the master and slave paths of the current mirror amplifier 12 would be related by the collector periphery ratio and this ratio could be predetermined to fix the negative impedance.

Either bipolar or field effect transistors could be utilized in the current mirror amplifier 12, with both $Q_1$ and $Q_2$ being either NPN or PNP bipolar transistors or either PMOS or NMOS field effect transistors, while $Q_3$ would be a transistor of complementary conductivity type. Of course, in any MOS/FET version of the current mirror amplifier 12, all of the transistor gates would be connected to ground through resistance means to provide a discharge path when no signal is applied to those gates, as is a well known practice to those skilled in the electronic arts. The specific bipolar transistor arrangement of the current mirror amplifier 12 shown in FIG. 1 provides a notable integrated circuit advantage over prior art negative impedance networks which utilize current mirror amplifiers therein. $Q_1$ and $Q_2$ in the master and slave paths are NPN transistors, while $Q_3$ within the bias means 14 is a PNP transistor. Therefore, the bulk of the current flow in the current mirror amplifier 12 passes through the NPN transistors which have a high current conduction to chip area ratio, while only the base drive current for $Q_1$ and $Q_2$ passes through the PNP transistor which has a low current conduction to chip area ratio. Furthermore, the bulk of the current flow through the master path in the current mirror amplifier 12 only presents a voltage drop across $Q_1$ in the FIG. 1 arrangement, whereas in prior art negative impedance networks having current mirror amplifiers and utilizing bipolar transistors, current through the master path of the current mirror amplifier encounters an increased voltage drop through a PNP transistor.

Figure 2:
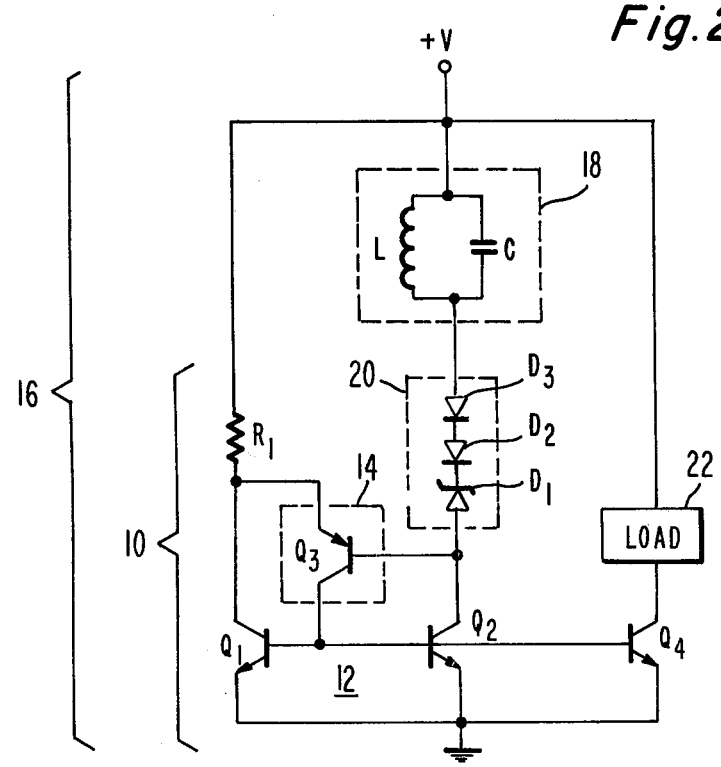
FIG. 2 is a schematic diagram of a circuit having a Q characteristic and having a negative impedance network similar to that of FIG. 1 incorporated therewith to modify its damping.

The negative impedance network of this invention has numerous applications in regenerative amplifiers and circuits which have a Q characteristic. The resonant circuits in some types of oscillators and narrow bandwidth filters are examples of Q characteristic circuits. FIG. 2 illustrates one such application wherein the negative impedance network 10 of FIG. 1 is substantially incorporated into an oscillator 16 which includes a resonant circuit 18 connected in series with the slave path of the current mirror amplifier 12. An inductance L and capacitance C are connected in parallel within the resonant circuit 18. The negative impedance across the slave path is set at a magnitude equal to at least the equivalent dynamic resistance of the resonant circuit 18 by selecting the value of $R_1$. For reasons well known to those skilled in the electronic arts, the resonant circuit 18 becomes oscillatory under these conditions and an oscillatory voltage at the frequency of the resonant circuit 18 is applied across the slave path of the current mirror amplifier 12 which consequently, develops an oscillatory current flow through its master and slave paths at the same frequency.

Although the voltage level across the slave path is set by positioning the wiper of $R_2$ in the negative impedance network 10 of FIG. 1, a means 20 for offsetting voltage is disposed in FIG. 2 to set the voltage level across the slave path. One convenient embodiment of the offsetting voltage means 20 is to series connect the forward biased junctions of semiconductor devices between $+V$ and the slave path of the current mirror amplifier 12. Of course, the desired magnitude of the voltage offset will depend on the magnitude of $+V$ and the voltage level desired across the slave path of the current mirror amplifier 12. However, any combination of forward biased semiconductor junctions may be utilized in the voltage offsetting means 20, such as those available across zener diode $D_1$ and diodes $D_2$ and $D_3$ in FIG. 2. Output from the oscillator 16 may be applied in many ways and one very convenient way is to connect a load 22 across $+V$ through the main conduction path of a transistor $Q_4$ that has its control electrode commonly connected to the control electrodes of $Q_1$ and $Q_2$. Because the main conduction path of $Q_4$ is actually a second slave path in the current mirror amplifier 12, the voltage thereacross and the current therethrough will be oscillatory at the frequency of the resonant circuit 18.

Those skilled in the arts will realize without further explanation that the negative impedance network of this invention is disclosed herein by describing only a few embodiments thereof and numerous changes in the details of construction and the combination or arrangement of parts could be made in these described embodiments without departing from the true scope and spirit of the invention. Therefore, the present invention should be construed as illustrative rather than limiting.

What I claim is:

1. In a negative impedance network of the type which includes a current mirror amplifier having bipolar master and slave path transistors of a first conductivity type in master and slave paths, respectively, the improvement comprising:

bias means for applying current through a path independent of both the master and slave paths to an interconnection of the control electrodes of the master and slave path transistors in inverse proportion to the voltage impressed across the slave path for making the current supplied by the slave path vary inversely to the voltage thereacross and thereby derive the negative impedance through the slave path, including a bipolar bias means transistor of a second conductivity type complementary to the first, said bias means transistor having an emitter electrode to which the collector electrode of said master path transistor is direct coupled, a collector electrode connected to the interconnection of the control electrodes of the master and slave path transistors to apply the bias current thereto, and having a bias electrode to which the voltage applied across the slave path is impressed;

the master and slave path transistors having their emitter electrodes commonly connected to a reference voltage level, a supply voltage level being applied through a resistance to the collector electrode of the master path transistor;

an intermediate voltage level between said supply voltage level and said reference voltage level being applied to both the base electrode of said bias means transistor and the collector electrode of the slave path transistor; and said intermediate voltage level being applied through a tuned inductance-capacitance circuit having an equivalent dynamic resistance, the negative impedance of the network being derived as the change in said intermediate voltage level divided by the change resulting therefrom in the level of current flow through the slave path and having a magnitude of at least the magnitude of said equivalent dynamic resistance to thereby result in oscillatory current flow through the slave path at the resonant frequency of said tuned circuit.

2. The negative impedance network of claim 1 wherein said resistance is a variable resistor and said intermediate voltage level is applied through a means for offsetting voltage.

3. The negative impedance network of claim 2 wherein an additional slave path transistor is disposed with its control electrode commonly connected to the control electrodes of the other master and slave path transistors and with its main conduction path series connected to a load across said supply voltage level, said load being thereby driven at the resonant frequency of the tuned circuit from said supply voltage level.

4. The negative impedance network of claim 2 wherein said voltage offsetting means includes at least one forward-biased junction of a semiconductor device.

5. A negative impedance oscillator circuit comprising:

first and second bipolar transistors of like conductivity type, having their respective emitter electrodes connected to a point of reference voltage, having their respective base electrodes interconnected, and having respective collector electrodes;

a third bipolar transistor of opposite conductivity type to that of said first and second bipolar transistors, having an emitter electrode connected to the collector electrode of said first transistor, having a base electrode connected to the collector electrode of said second transistor, and having a collector electrode connected to the interconnection of the base electrodes of said first and second transistors;

resistance means for connecting the collector electrode of said first transistor to a point of supply voltage; and a tuned inductance-capacitance circuit, having an equivalent dynamic-impedance, which tuned circuit connects to the collector electrode of said second transistor for applying an intermediate voltage level between that of the supply voltage and that of the reference voltage thereto, the current flow in said second transistor including an oscillatory component at the resonant frequency of the tuned circuit.

6. The oscillator circuit of claim 5 wherein said resistance means is a variable resistor and wherein the intermediate voltage is applied through a means for offsetting voltage.

7. The oscillator circuit of claim 6 wherein a further transistor is disposed with its control electrode connected to the interconnection of the base electrodes of said first and second bipolar transistors and with its main conduction path connected by a load to the point of supply voltage for driving the load at the resonant frequency of the tuned circuit.

8. The oscillator circuit of claim 7 wherein the means for offsetting voltage includes at least one forward-biased junction of a semiconductor device.

* * * * *